(12) United States Patent
Laffoley

(10) Patent No.: US 7,063,797 B2
(45) Date of Patent: Jun. 20, 2006

(54) MOUNTING ELECTRONIC COMPONENTS

(75) Inventor: Brian Laffoley, Fife (GB)

(73) Assignee: STMicroelectronics Ltd., Buckinghamshire (GB)

( * ) Notice: Subject to any disclaimer, the term of this patent is extended or adjusted under 35 U.S.C. 154(b) by 161 days.

(21) Appl. No.: 10/789,829

(22) Filed: Feb. 27, 2004

(65) Prior Publication Data

US 2004/0203237 A1    Oct. 14, 2004

Related U.S. Application Data

(62) Division of application No. 09/938,850, filed on Aug. 24, 2001, now Pat. No. 6,722,029.

(51) Int. Cl.
*H01L 21/302* (2006.01)
(52) U.S. Cl. ............... 216/17; 217/65; 217/75; 217/106; 217/105
(58) Field of Classification Search .......... 216/17
See application file for complete search history.

(56) References Cited

U.S. PATENT DOCUMENTS

| 4,790,894 | A | 12/1988 | Homma et al. ........... 156/250 |
| 5,369,551 | A | 11/1994 | Gore et al. ............... 361/767 |
| 6,423,904 | B1 * | 7/2002 | Hayami ................... 174/255 |
| 6,518,677 | B1 * | 2/2003 | Capote et al. ........... 257/783 |

FOREIGN PATENT DOCUMENTS

| DE | 3730497 | 3/1989 |
| EP | 0180730 | 5/1986 |
| EP | 0659032 | 6/1995 |
| EP | 0712266 | 5/1996 |

OTHER PUBLICATIONS

Patent abstracts of Japan, vol. 018, No. 326 (E-1565), Jun. 21, 1984 & JP 06 077631A (Matsushita Electric Ind Co. Ltd), Mar. 18, 1994.
Patent abstracts of Japan, vol. 1995,No. 07, Aug. 31, 1995 & JP 07 111380 A (Murata Mfg. Co. Ltd.), Apr. 25, 1995.
Patent abstracts of Japan, vol. 1996, No. 12, Dec. 26, 1996 & JP 08 204328 A (Mitsubishi Electric Corp.), Aug. 9, 1996.

* cited by examiner

*Primary Examiner*—Nadine G. Norton
*Assistant Examiner*—Patricia George
(74) *Attorney, Agent, or Firm*—Lisa K. Jorgenson; Allen, Dyer, Doppelt, Milbrath & Gilchrist, P.A.

(57) ABSTRACT

A method of mounting an electronic component having at least one contact extending across a part of its undersurface may include providing a support smaller in area than the undersurface of the component and having a contact pad for connection to the contact. The contact pad may have a first portion extending across an upper surface of the support adjacent one edge and a second portion extending from the edge across a side surface of the support. The method may also include positioning the electronic component and the support with the undersurface of the component adjacent the upper surface of the support. This is done so that the first portion of the contact pad is aligned with and spaced apart from a first portion of the contact, and the second portion of the contact pad is aligned with and disposed inwardly of a second portion of the contact.

10 Claims, 2 Drawing Sheets

MOUNTING ELECTRONIC COMPONENTS

This application is a divisional of Ser. No. 09/938,850 filed on Aug. 24, 2001, now U.S. Pat. No. 6,722,029 the disclosures of which are hereby incorDorafed by reference in their entirety.

FIELD OF THE INVENTION

The present invention relates to the field of electronic circuits, and, more particularly, to a method of mounting electronic components. Further, the present invention is particularly applicable to the mounting of integrated circuits (ICs) on printed circuit boards (PCBs), including flexible printed circuit boards, though the present invention may also be used to mount other components on PCBs, or to mount components on other types of carriers, for example.

BACKGROUND OF THE INVENTION

There are many situations where it is desirable to minimize the overall dimensions of an electronic device. One example is a miniature video camera using an image sensor formed as a single IC.

An IC is generally mounted on a PCB having a larger area. Such an arrangement is illustrated in FIG. 1 in a surface mount form. An IC 10 has a plurality of contacts 12 extending down the side face 14 and under the undersurface 16 of the IC 10. The IC 10 is mounted on a PCB 18 which has a plurality of copper contact pads 20. The contact 12 is connected to the contact pad 20 by a body 22 of solder which includes a planar portion 22A and a fillet 22B. This arrangement requires the PCB 18 to extend beyond the side of the IC 10 by a distance of at least A. In practice, a greater distance B will be required, since the copper contact pad 20 will not normally extend to the edge of the PCB 18.

Another prior art approach includes mounting an IC in a manner which reduces the horizontal dimension from that of FIG. 1. This prior art approach is illustrated in FIG. 2, in which like parts are denoted by like reference numerals. Here, the IC 10 and the PCB 18 are of the same horizontal extent. The contact 12 is positioned only on the underside 16 of the IC 10, and the copper contact pad 20 extends to the edge of the PCB 18. The connection is made by a solder body 22' which has only a planar portion. The solder fillet is lost, which degrades the mechanical strength and reliability of the connection, and may provide a poorer electrical connection.

SUMMARY OF THE INVENTION

An object of the present invention is to provide a method of mounting electronic components which facilitates minimization of the size of a device.

The invention in its various aspects is defined in the claims appended hereto.

BRIEF DESCRIPTION OF THE DRAWINGS

An embodiment of the invention will now be described, by way of example, referring to the drawings, in which.

DETAILED DESCRIPTION OF THE PREFERRED EMBODIMENTS

Figure 1:
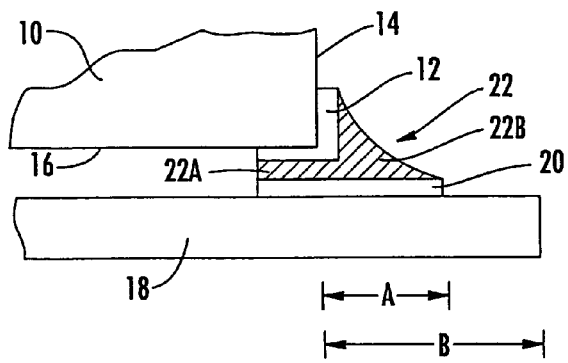
FIGS. 1 and 2, previously discussed, are cross-sectional views of various prior art mounting configurations.
Figure 2:
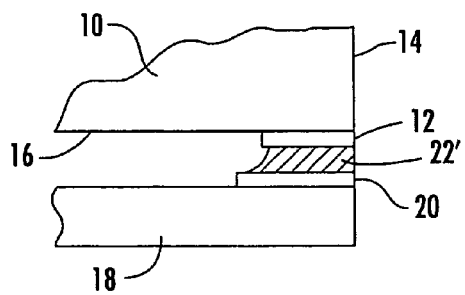
Figure 3:
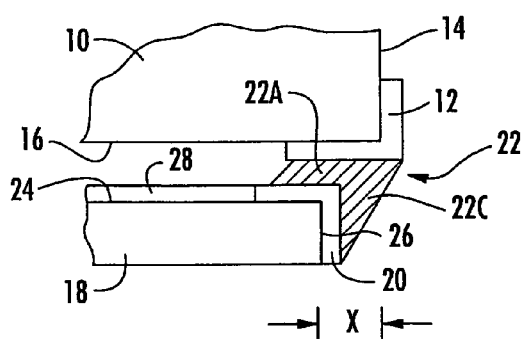
FIG. 3 is a cross-sectional view illustrating one embodiment of the present invention.

Referring to FIG. 3, an IC 10 has a plurality of contacts 12 (only one of which is shown for clarity of illustration) extending down the side face 14 and under the undersurface 16 of the IC 10. The IC 10 is mounted on a PCB 18, which may be a flexible PCB and which has a plurality of copper contact pads 20. Again, only one of the copper contact pads 20 is shown for clarity of illustration. The copper contact pad extends over the top surface 24 and down the side 26 of the PCB 18. The contact pad 20 is typically connected to other circuitry (not shown) by a copper track 28.

Figure 4:
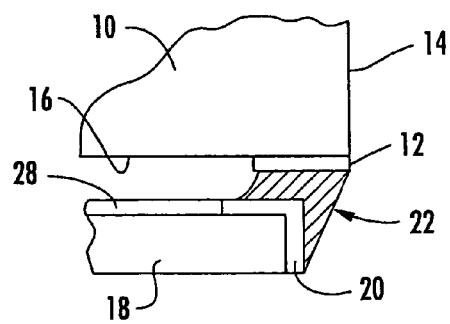
FIG. 4 is a cross-sectional view illustrating an alternate embodiment of the present invention.

The PCB 18 is smaller in horizontal dimension than the IC 10, its edge being set in by a distance X. The contact 12 is connected to the contact pad 20 by a body 22 of solder which includes a planar portion 22A and a fillet 22C engaging the side of the contact pad 20. The embodiment of FIG. 3 thus provides the advantages of a filleted solder joint within a smaller package size. A modified form of the embodiment of FIG. 3 is illustrated in FIG. 4, in which the contact 12 is located only on the under surface 16 of the IC 10.

Figure 5A:
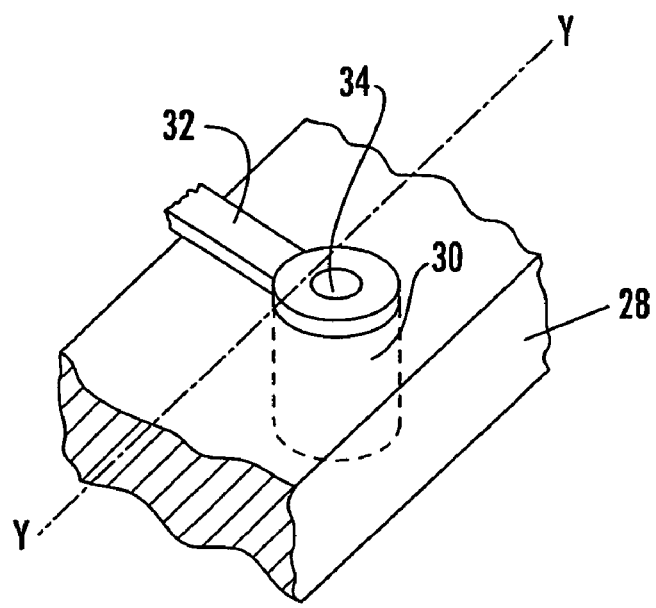
FIGS. 5A and 5B are perspective views showing the manufacture of a circuit board for use in the embodiments of FIGS. 3 and 4.
Figure 5B:
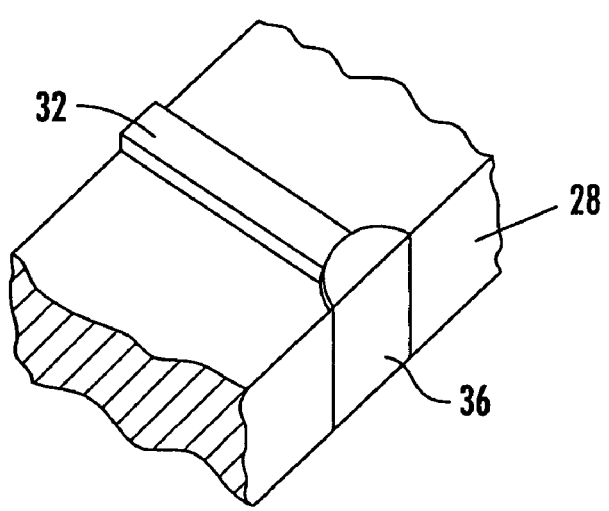

Turning now to FIG. 5, one method for forming the contact pad 20 used in the foregoing embodiments will now be described. A PCB substrate 28 is drilled at 30 and is then plated in the conventional manner to form a track 32 and a plated-through via 34. The board is then cut along the line Y—Y to produce the side contact area 36 seen in FIG. 5B. The mounting of the IC 10 to the PCB 18 can be carried out using conventional techniques, preferably those in which solder paste is deposited by printing techniques and the assembly is heated to reflow the solder.

Yet another feature of the invention includes a modification of the conventional process. It is conventional to deposit solder paste in the required pattern on the PCB, press the IC or other device(s) into the solder paste from above, and then heat the assembly to reflow the solder. This procedure may be followed with the present invention, but can suffer difficulties because the PCB is smaller than the IC. Thus, according to the present invention, the IC may be positioned upside down, solder paste deposited in the required pattern on the underside of the IC, and the PCB pressed in an upside down orientation onto the solder paste. Further, this orientation is maintained during heating, solder reflow, and cooling.

Those of skill in the art will appreciate that various modifications and improvements may be made to the foregoing embodiments within the scope of the present invention.

The invention claimed is:

1. A method for making a printed circuit board comprising:
   forming at least one via in a substrate;
   plating the at least one via with a conductor;
   cutting the substrate along a path which passes through the at least one via to form at least one contact pad, the at least one contact pad having a first portion extending across an upper surface of the substrate adjacent an edge thereof and a second portion extending from the edge across a side surface of the substrate.

2. A method for making an electronic device comprising:
providing a printed circuit board; and
mounting an integrated circuit on the printed circuit board, the printed circuit board having a smaller area than an area of the integrated circuit.

3. The method of claim 2 wherein the printed circuit board comprises a plurality of contact pads each having a first portion extending across an upper surface of the printed circuit board adjacent an edge thereof and a second portion extending from the edge across a side surface of the printed circuit board.

4. The method of claim 3 wherein the integrated circuit comprises a plurality of contacts corresponding to the plurality of contact pads, each of the plurality of contacts having at least a portion thereof extending across a portion of an undersurface of the integrated circuit.

5. The method of claim 4 wherein mounting the integrated circuit on the printed circuit board further comprises forming a respective solder connection between respective contacts and contact pads, each solder connection comprising a fillet portion.

6. A method for making an electronic device comprising:
forming at least one via in a substrate;
plating the at least one via with a conductor;
cutting the substrate along a path which passes through the at least one via to form at least one contact pad, the at least one contact pad having a first portion extending across an upper surface of the substrate adjacent an edge thereof and a second portion extending from the edge across a side surface of the substrate; and
mounting an electronic component comprising at least one contact on the substrate so that the contact is electrically connected to the at least one contact pad.

7. The method of claim 6 wherein mounting further comprises:
forming a solder connection between the at least one contact and the at least one contact pad, the solder connection comprising a generally planar portion between the first portion of the at least one contact and the at least one contact pad; and
forming a fillet portion extending angularly from the second portion of the at least one contact to the second portion of the at least one contact pad.

8. The method of claim 7 wherein forming the solder connection comprises applying solder paste between the at least one contact and the at least one contact pad and heating the assembly to cause the solder paste to flow.

9. The method of claim 8 wherein forming the solder connection further comprises orienting the electronic component in an upside down position, applying the solder paste to the electronic component, applying the support to the solder paste in the upside down position, and heating the electronic component, the support, and the solder paste.

10. The method of claim 9 wherein forming the solder connection further comprises maintaining the assembly in the upside down position during cooling.

* * * * *

UNITED STATES PATENT AND TRADEMARK OFFICE
CERTIFICATE OF CORRECTION

| | |
|---|---|
| PATENT NO. | : 7,063,797 B2 |
| APPLICATION NO. | : 10/789829 |
| DATED | : June 20, 2006 |
| INVENTOR(S) | : Laffoley |

It is certified that error appears in the above-identified patent and that said Letters Patent is hereby corrected as shown below:

Title Page (30)   Insert: -- Foreign Application Priority Data
                                   09/02/2000   (UK) ........... 0021596.2 --

Column 1, Line 3   Delete: "incorDorafed"
                    Insert: -- incorporated --

Signed and Sealed this

Sixth Day of February, 2007

JON W. DUDAS
*Director of the United States Patent and Trademark Office*